US012740375B2

(12) United States Patent
Bosboom

(10) Patent No.: US 12,740,375 B2
(45) Date of Patent: Sep. 15, 2026

(54) APPARATUS, SYSTEM AND METHOD FOR PROVIDING A FLIPPER FOR IN-PROCESS SUBSTRATES

(71) Applicant: JABIL INC., St. Petersburg, FL (US)

(72) Inventor: Jeroen Bosboom, St. Petersburg, FL (US)

(73) Assignee: JABIL INC.

( * ) Notice: Subject to any disclaimer, the term of this patent is extended or adjusted under 35 U.S.C. 154(b) by 1070 days.

(21) Appl. No.: 17/797,640

(22) PCT Filed: Feb. 12, 2021

(86) PCT No.: PCT/US2021/017947
§ 371 (c)(1),
(2) Date: Aug. 4, 2022

(87) PCT Pub. No.: WO2021/163553
PCT Pub. Date: Aug. 19, 2021

(65) Prior Publication Data

US 2023/0133493 A1 May 4, 2023

Related U.S. Application Data

(60) Provisional application No. 62/975,604, filed on Feb. 12, 2020.

(51) Int. Cl.
*B25J 11/00* (2006.01)
*B25J 9/00* (2006.01)
(Continued)

(52) U.S. Cl.
CPC ........ *H10P 72/7602* (2026.01); *B25J 9/0087* (2013.01); *B25J 9/1612* (2013.01);
(Continued)

(58) Field of Classification Search
CPC ............. H01L 21/68707; B25J 11/0095; B25J 9/1612; B25J 9/0087; B25J 19/0079
(Continued)

(56) References Cited

U.S. PATENT DOCUMENTS 4,568,234 A * 2/1986 Lee .................. H01L 21/67313 414/811
5,292,222 A * 3/1994 Malagrino, Jr. ....... G11B 17/22 414/815
(Continued)

FOREIGN PATENT DOCUMENTS

CN 101096100 1/2008
CN 103386689 11/2013
(Continued)

OTHER PUBLICATIONS

Chinese Office Action (including English translation) issued in App. No. CN202180013828, dated Jun. 30, 2025, 16 pages.
(Continued)

*Primary Examiner* — Paul T Chin
(74) *Attorney, Agent, or Firm* — Riverside Law LLP

(57) ABSTRACT

An apparatus, system and method for a substrate flipper capable of accommodating substrates of varying sizes. The apparatus, system and method may include a base housing providing at least a portion of a rotating feature; an arm enclosure rotatably associated with the rotating feature and providing at least one arm actuator, and at least one gripper actuator; two arms at two substantially distal points with respect to one another along the arm enclosure, each of the two arms being communicatively associated with the at least one arm actuator; and a gripper associated with each of the two arms distal from the arm enclosure, communicatively associated with the at least one gripper actuator and capable of gripping one of the substrates upon actuation of the gripper. The actuation of the at least one arm actuator
(Continued)

effectuates a change in distance between central longitudinal axes of each of the two arms.

25 Claims, 10 Drawing Sheets

(51) Int. Cl.
*B25J 9/16* (2006.01)
*B25J 19/00* (2006.01)
*H10P 72/76* (2026.01)
*B25J 9/10* (2006.01)
*B25J 13/08* (2006.01)

(52) U.S. Cl.
CPC ....... *B25J 11/0095* (2013.01); *B25J 19/0079* (2013.01); *B25J 9/104* (2013.01); *B25J 13/08* (2013.01); *B25J 19/0025* (2013.01)

(58) Field of Classification Search
USPC .......................................................... 294/207
See application file for complete search history.

(56) References Cited

U.S. PATENT DOCUMENTS 5,299,681 A * 4/1994 Kadono ............. H05K 13/0417 198/690.1
5,460,476 A * 10/1995 Gazza .................. B65G 1/0435 414/280
6,039,375 A 3/2000 Bauman
6,129,350 A * 10/2000 St. Ours .................. B41F 13/03 270/32
6,386,609 B1 5/2002 Govzman
6,592,324 B2 7/2003 Downs et al.
6,592,423 B1 7/2003 Boyle
6,626,476 B1 9/2003 Govzman
6,660,139 B1 * 12/2003 Sendai ................. C25D 17/001 118/428
8,545,165 B2 * 10/2013 Moura .............. H01L 21/68785 414/217
8,827,337 B2 * 9/2014 Murata ................ B25J 15/0009 294/111
8,991,884 B2 * 3/2015 DeLouis .............. B25J 15/0009 294/111
9,618,857 B2 * 4/2017 Volkov ................ G03F 7/70741
10,014,205 B2 * 7/2018 Yoshida ............ H01L 21/67253
10,049,910 B2 * 8/2018 Kirino ............... H01L 21/67306
10,065,327 B1 * 9/2018 Chen .................... B25J 15/0408
10,483,142 B1 11/2019 Tan
10,668,626 B2 * 6/2020 Wang ........................ B25J 9/041
11,305,436 B2 * 4/2022 Tao ...................... B25J 15/0253
11,643,285 B1 * 5/2023 Wei ........................ B65G 47/90 414/751.1
11,999,478 B2 * 6/2024 Lee .......................... B64D 1/22
2009/0092470 A1 4/2009 Bonora
2010/0135761 A1 * 6/2010 Hebiishi ........... H01L 21/67742 414/783
2012/0237326 A1 * 9/2012 Van Ness ............. A61G 3/0236 414/812
2016/0181135 A1 6/2016 Buonodono
2016/0252826 A1 9/2016 Volkov et al.
2017/0067163 A1 3/2017 Papasouliotis
2018/0141219 A1 5/2018 Bonora
2019/0366556 A1 * 12/2019 Wang ................... B25J 15/0293
2019/0393070 A1 * 12/2019 Bosboom .......... H01L 21/68707
2023/0191627 A1 * 6/2023 Bosboom ............. B25J 15/0683 700/245

FOREIGN PATENT DOCUMENTS

JP 2010135381 A 6/2010
WO 2007101228 9/2007

OTHER PUBLICATIONS

Extended European Search Report issued in App. No. EP21754161, dated Feb. 15, 2024, 8 pages.
International Search Report for PCT/US2021/017947, dated Jun. 7, 2021.
Written Opinion of the International Searching Authority for PCT/US2021/017947, dated Jun. 7, 2021.
Chinese Office action (including English translation) issued in App. No. CN202180013828, dated Feb. 27, 2026 (pp. 1-16).

* cited by examiner

APPARATUS, SYSTEM AND METHOD FOR PROVIDING A FLIPPER FOR IN-PROCESS SUBSTRATES

CROSS-REFERENCE TO RELATED APPLICATION

This application claims the benefit of priority to International Patent Application No. PCT/US2021/017947, filed Feb. 12, 2021, entitled: APPARATUS, SYSTEM AND METHOD FOR PROVIDING A FLIPPER FOR IN-PROCESS SUBSTRATES, which claims the benefit of priority of U.S. Provisional Application No. 62/975,604, filed Feb. 12, 2020, entitled APPARATUS, SYSTEM AND METHOD FOR PROVIDING A FLIPPER FOR IN-PROCESS SUBSTRATES, the entirety of which is incorporated herein by reference as if set forth in its entirety.

BACKGROUND

Field of the Disclosure

The present disclosure relates to the transfer and processing of articles, such as semiconductor wafers, and more particularly to an apparatus, system and method for providing a flipper for in-process substrates.

Description of the Background

The use of robotics is well established as a manufacturing expedient, particularly in applications where human handling is inefficient and/or undesirable. One such circumstance is in the semiconductor arts, in which robotics and automated stations are used to handle and hold wafers during various process steps. Such process steps may include, by way of example, chemical mechanical planarization (CMP), etching, deposition, passivation, and various other processes in which a sealed and/or “clean” environment must be maintained, such as to limit the likelihood of contamination and to ensure that various specific processing conditions are met.

Current practice in the semiconductor arts to robotically handle these wafers often includes the use of a flipper/aligner operably attached to the robotics, such as in order to load semiconductor wafers from a loading stack into the various processing ports that may correspond to the aforementioned exemplary process steps. The robotics are employed to deploy the flipper/aligner to retrieve the wafer from a particular port or stack, such as before and/or after processing in an associated process chamber, and/or to associate the wafer with a station, such as may include a station chuck onto which the wafer is placed.

The wafer may thus be shuttled by the robotics connectively associated with the flipper/aligner between stations for additional processing. When a given wafer process is complete, the robotics may move the processed wafer from its station and return the processed semiconductor wafer to a loading port. It is typical that a stack of several semiconductor wafers is processed in this manner using the flipper/aligner-to-station movement during each process run.

The known art includes robotics to flip and rotate wafers and similar substrates, such as for inspection during or after processing. However, such known flippers generally cannot handle multiple wafer/substrate sizes. As referenced throughout, not only do silicon wafer sizes vary significantly, but so too do the sizes of other substrates that the flipper may be required to handle. Therefore, the limitations on modifications to the substrate sizes that known flipper can handle, in conjunction with the lack of independent control input to change the substrate-handling size of known flippers in-process, limits the applicability of known flippers across different substrates and different processes, and make those known flippers completely un-scalable.

Yet further, known flippers have a substantially open design—that is, the robotics are not encased, at least in part, and so particulate is necessarily generated by known flippers. As such, known flippers are not designed for cleanliness, and are unsuitable for use in clean-room environments.

Accordingly, there is a need for a substrate flipper that is scalable and that provides functionality substantially in accordance with clean room standards.

SUMMARY

Certain embodiments are and include an apparatus, system and method for a substrate flipper capable of accommodating substrates of varying sizes. The apparatus, system and method may include a base housing providing at least a portion of a rotating feature; an arm enclosure rotatably associated with the rotating feature and providing at least one arm actuator, and at least one gripper actuator; two arms at two substantially distal points with respect to one another along the arm enclosure, each of the two arms being communicatively associated with the at least one arm actuator; and a gripper associated with each of the two arms distal from the arm enclosure, communicatively associated with the at least one gripper actuator and capable of gripping one of the substrates upon actuation of the gripper. The actuation of the at least one arm actuator effectuates a change in distance between central longitudinal axes of each of the two arms.

Thus, the disclosure provides at least an apparatus, system and method for providing a substrate flipper that is scalable and that provides functionality substantially in accordance with clean room standards.

BRIEF DESCRIPTION OF THE DRAWINGS

The exemplary compositions, systems, and methods shall be described hereinafter with reference to the attached drawings, which are given as non-limiting examples only, in which.

DETAILED DESCRIPTION

Figure 1:
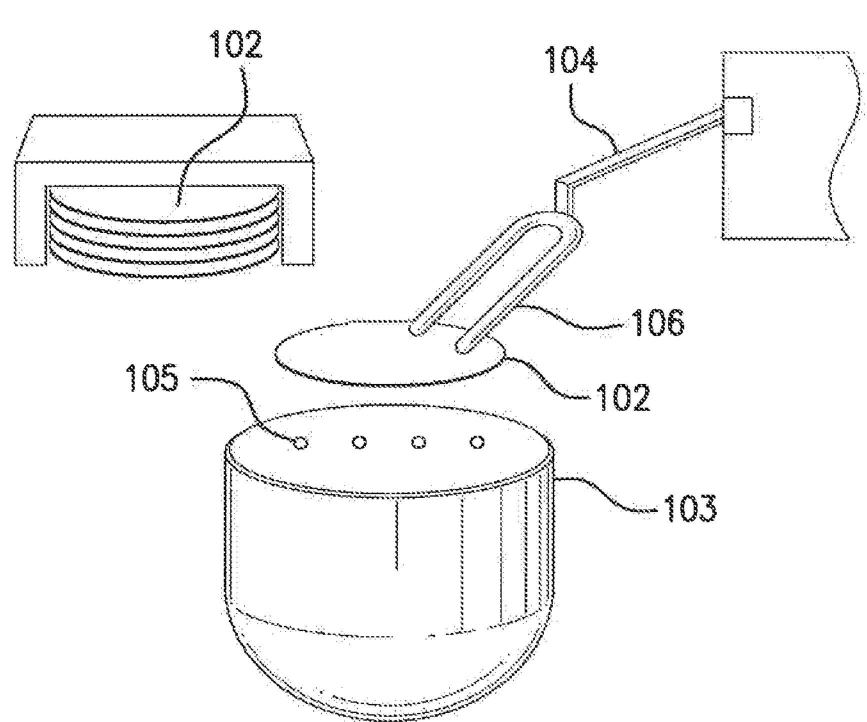
FIG. 1 is an illustration of a substrate handling system.

The figures and descriptions provided herein may have been simplified to illustrate aspects that are relevant for a clear understanding of the herein described apparatuses, systems, and methods, while eliminating, for the purpose of clarity, other aspects that may be found in typical similar devices, systems, and methods. Those of ordinary skill may thus recognize that other elements and/or operations may be desirable and/or necessary to implement the devices, systems, and methods described herein. But because such elements and operations are known in the art, and because they do not facilitate a better understanding of the present disclosure, for the sake of brevity a discussion of such elements and operations may not be provided herein. However, the present disclosure is deemed to nevertheless include all such elements, variations, and modifications to the described aspects that would be known to those of ordinary skill in the art.

Embodiments are provided throughout so that this disclosure is sufficiently thorough and fully conveys the scope of the disclosed embodiments to those who are skilled in the art. Numerous specific details are set forth, such as examples of specific components, devices, and methods, to provide a thorough understanding of embodiments of the present disclosure. Nevertheless, it will be apparent to those skilled in the art that certain specific disclosed details need not be employed, and that embodiments may be embodied in different forms. As such, the disclosed embodiments should not be construed to limit the scope of the disclosure. As referenced above, in some embodiments, well-known processes, well-known device structures, and well-known technologies may not be described in detail.

The terminology used herein is for the purpose of describing particular embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The steps, processes, and operations described herein are not to be construed as necessarily requiring their respective performance in the particular order discussed or illustrated, unless specifically identified as a preferred or required order of performance. It is also to be understood that additional or alternative steps may be employed, in place of or in conjunction with the disclosed aspects.

When an element or layer is referred to as being "on", "upon", "connected to" or "coupled to" another element or layer, it may be directly on, upon, connected or coupled to the other element or layer, or intervening elements or layers may be present, unless clearly indicated otherwise. In contrast, when an element or layer is referred to as being "directly on," "directly upon", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). Further, as used herein the term "and/or" includes any and all combinations of one or more of the associated listed items.

Yet further, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another element, component, region, layer or section. Thus, terms such as "first," "second," and other numerical terms when used herein do not imply a sequence or order unless clearly indicated by the context. Thus, a first element, component, region, layer or section discussed below could be termed a second element, component, region, layer or section without departing from the teachings of the embodiments.

FIG. 1 illustrates an automated handling system 100 suitable to precisely handle semiconductor wafers, films or like-substrates 102, of varying diameters, compositions and physical attributes. The handling system 100 may be capable of the substrates 102 in a rapid, ordered succession for processing. The substrates 102 supplied may be manipulated or transferred among various stationary points 103 for processing, in part, by robotics, such as a robotic armature 104, equipped with an edge gripping system 106 adapted to perform the aforementioned manipulation and transfer. The stationary points 103 may comprise one or more chucks, such as may grip the substrates 102 upon placement of the substrates 102 onto the chuck. This gripping may be performed, by way of example, through the use of one or more vacuums 105.

Not only may substrates 102 vary in shape or diameter, they are also typically manufactured according to standardized specifications which, among other dimensional tolerances including the diameter, may require the surface of the stationary points 103 for receiving substrates 102 thereon to be substantially planar, such as with a flatness of 1.5 microns or less. Substrates may be silicon wafers, by way of example, such as 200 mm silicon wafers, for example, which may have one standard diameter of 200+/−0.2 mm and one standard thickness such as 675+/−25 microns. A typical wafer thickness after processing may range from about 500 microns to about 700 microns. Hence, maintenance of flatness across the substrate 102 during interaction of the substrate 102 with the stationary point 103 and with the robotic 104 and edge gripper 106 is key to obtaining acceptable levels of substrate throughput and waste in handling system 100.

Figure 2:
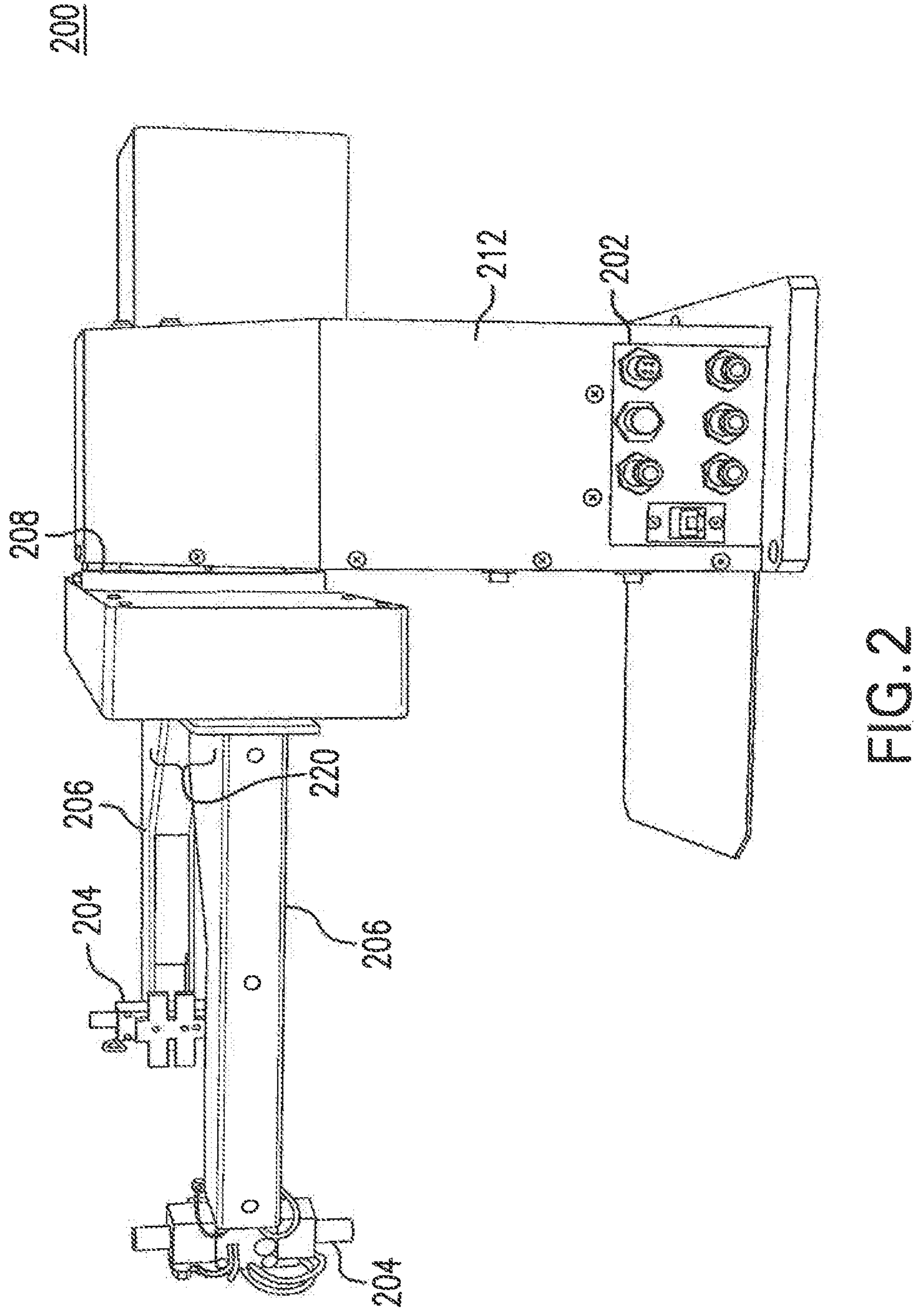
FIG. 2 is an illustration of aspects of a substrate flipper.

FIG. 2 illustrates a side view of a disclosed substrate flipper 200. As illustrated, the flipper 200 may include a power and electronics interface 202 (P and E interface), and powered, active grippers 204 at the distal end of each of two moveable arms 206. Further illustrated is a rotating feature 208 that allows for simultaneous rotation of the flipper arms 206, such as rotation from the arms 206 co-residing in a horizontal access to the arms 206 co-residing along the vertical axis. As shown, it is typical that the rotating feature 208 reside at the distal end of the arms 206 from the grippers 204, and that aspects of the rotating feature 208 reside within a main housing 212 that also includes the P and E interface 202 referenced above.

The disclosed flipper 200 may have a programmably adjustable arm offset distance 220 from a center point between the arms 206, which correspondingly adjusts the distance between the grippers 204 to allow for variability in the size of the handled item 102 (not shown in FIG. 2). By way of example, handled items may include film frames, bare or processed wafers, glass reticles, or other in-process substrates. By way of example, the disclosed embodiments may allow for handling of film frames in a range of 200 mm to 300 mm, and wafers in a similar size range. Of course, it will be appreciated by the skilled artisan in light of the discussion herein that the adjustable arm offset may allow for scalability of item handling to items of size 450 mm or larger, by way of nonlimiting example.

Figure 3:
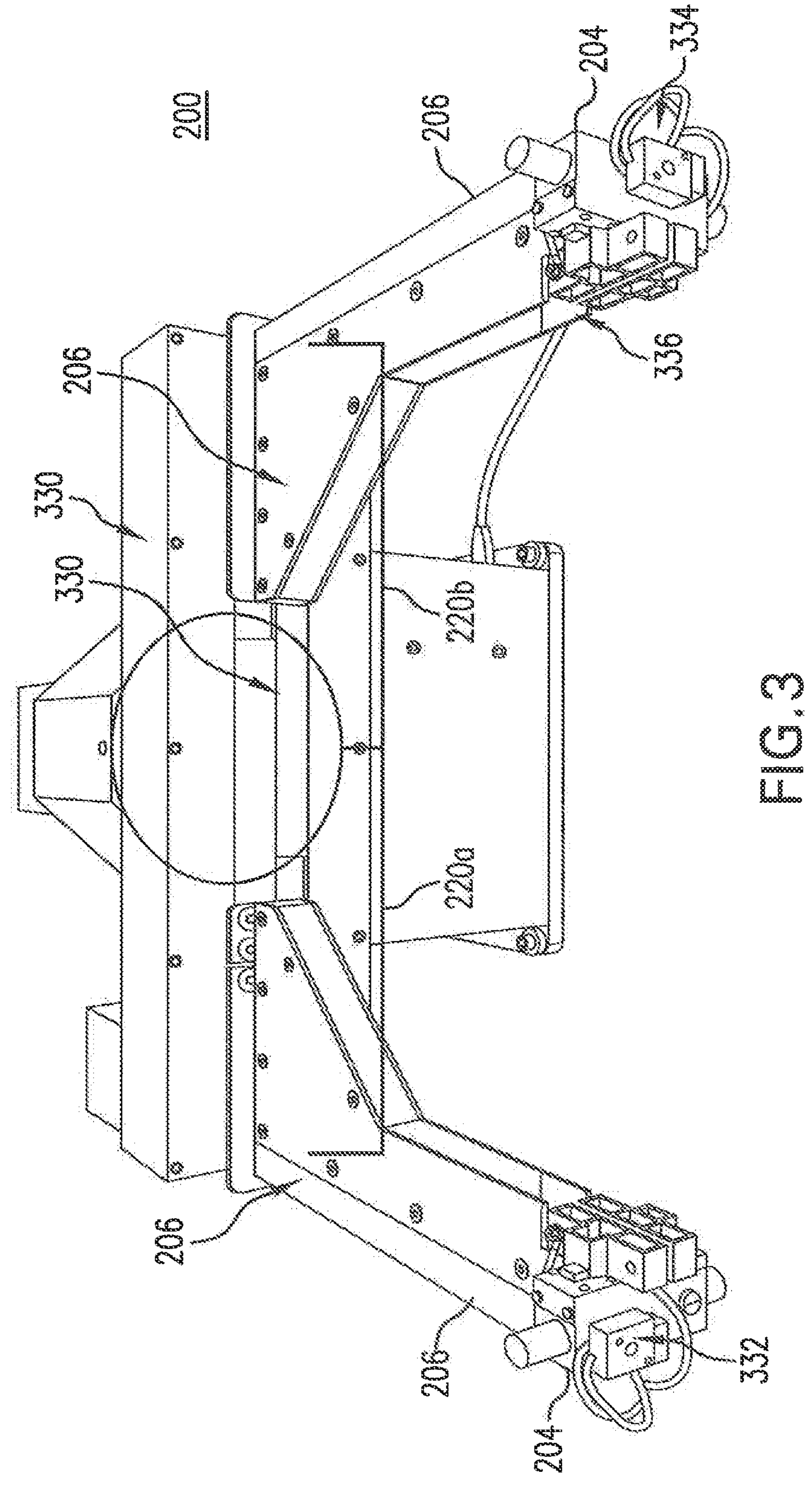
FIG. 3 is an illustration of aspects of a substrate flipper.

More specifically, FIG. 3 illustrates a front view of a flipper 200 in accordance with the embodiments. As illustrated, the offset 220*a, b* between the arms may be programmably adjustable, and may, preferably be synchronized, across a given offset stroke. By way of example, the offset stroke may be in the range of 150 mm to 250 mm, such as specifically being 190 mm.

Also illustrated is a labyrinth style gripper arm base enclosure 330. Of note, as the arms 206 adjust outwardly, the labyrinth style enclosure 330 continues to enclose the electronics and mechanicals of the rotation feature 208 and the arm offset adjustment, thereby enhancing workstation cleanliness.

The grippers 204 illustrated in FIG. 3 at the distal end of the arms 206 may also provide clean room level workstation cleanliness. These grippers 204 may comprise vacuum scavenged roller bearings 332, by way of example, to enhance both grip and cleanliness. Moreover, the grippers 204 may include failsafe close and opening features 334, such as may interact with a closed-loop sensing system 336. By way of example, a sensing system 336 may include through beam sensing, as illustrated, programmable pressure, sensing, weight transducers, or other sensing aspects apparent to the skilled artisan.

Figure 4:
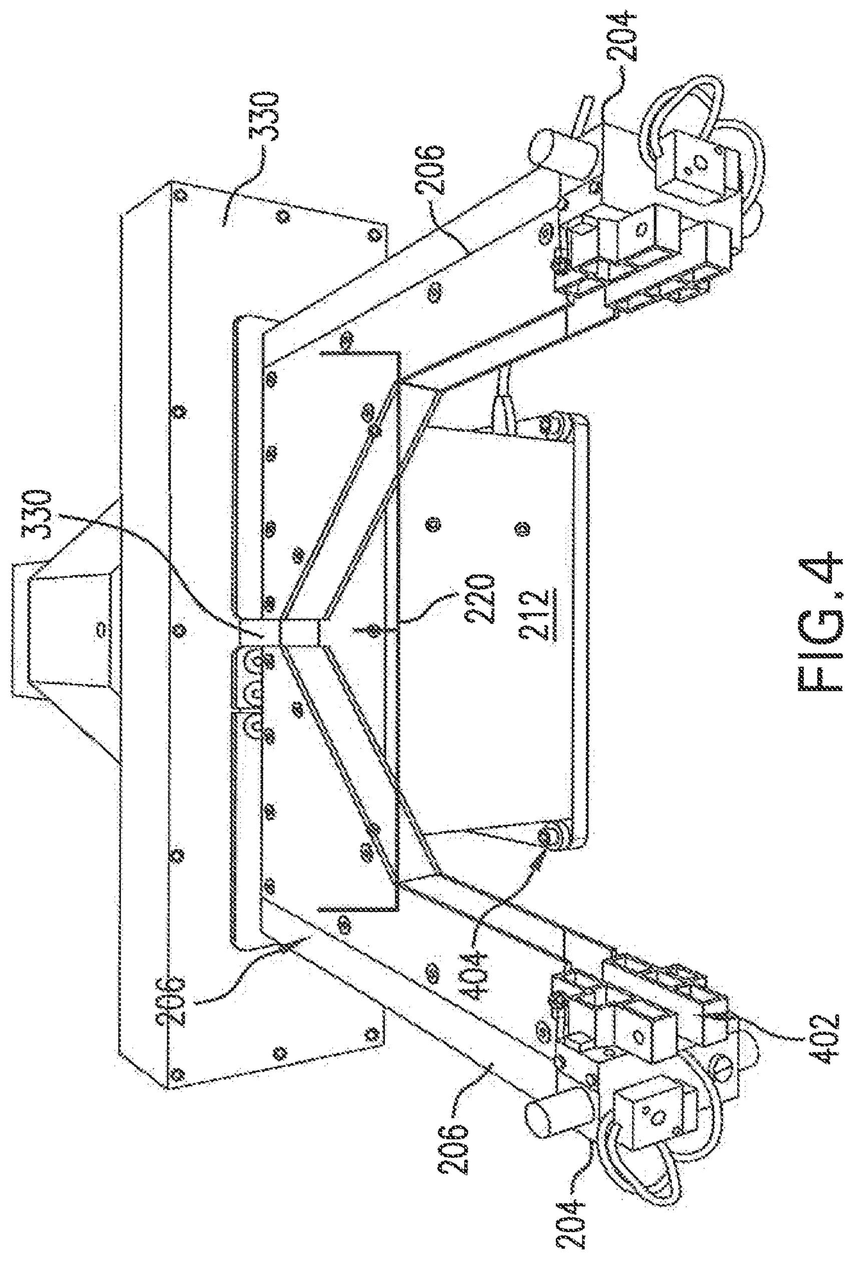
FIG. 4 is an illustration of aspects of a substrate flipper.

FIG. 4 illustrates a similar embodiment to that of FIG. 3, but with the arm offset 220 adjusted for gripping of smaller items 102 (not shown). That is, the labyrinth style enclosure 330 is less exposed as the arm stroke is programmably adjusted to bring the arms 206 closer together. Also illustrated in FIG. 4 are gripper clamps 204 having rubber clamp pads 402 thereon. Such pads may provide both improved grip of the gripped item, as well as static electricity dissipation during handling and processing. Also of note in FIG. 4 is an optional planarity adjustment 404 for base housing 212.

Figure 5:
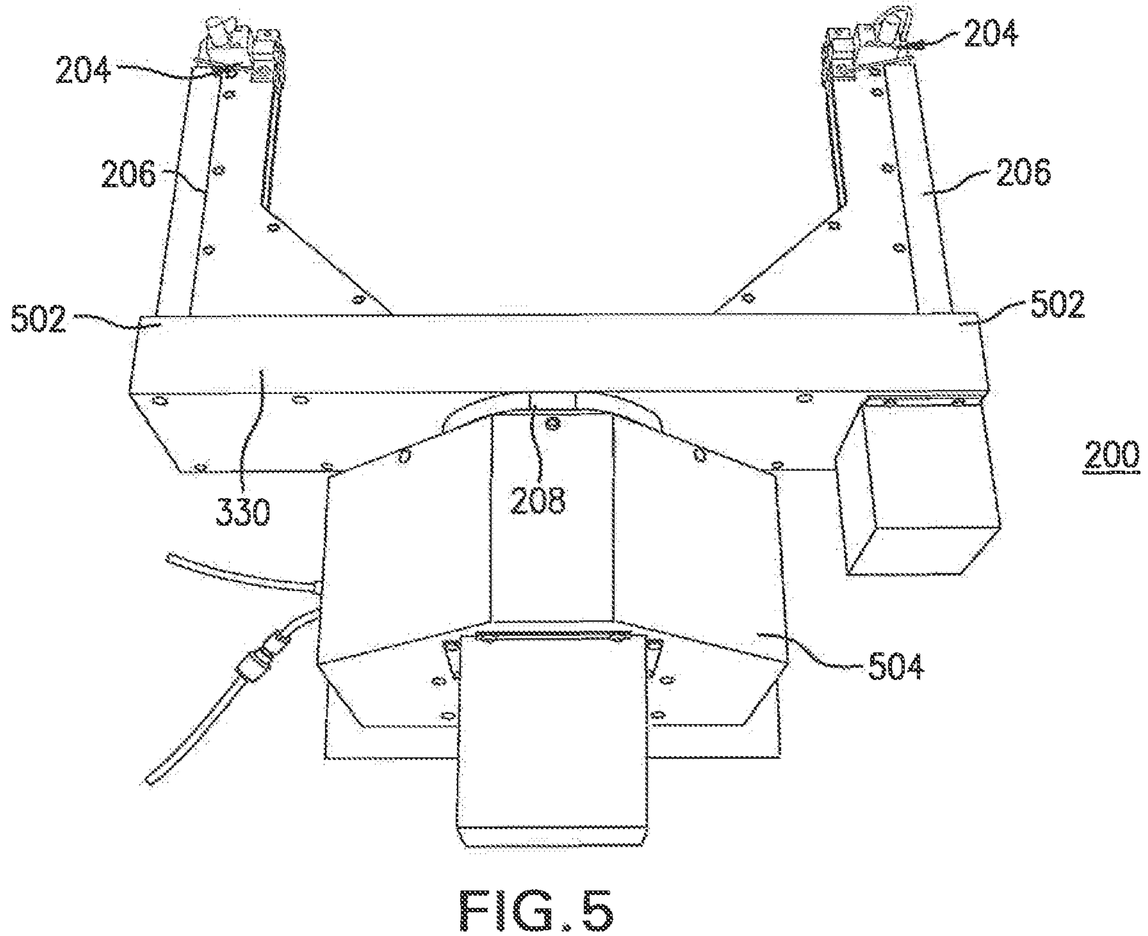
FIG. 5 is an illustration of aspects of a substrate flipper.

FIG. 5 illustrates a rear top view of a flipper 200 according to the embodiments. As shown, the base 502 of the arms 206 is suitably enclosed within housing 330, and is rotatably associated with the rotating feature 208. The rotating feature 208, and aspects of the power and electronics for the arms 206 and the grippers 204, are at least partially enclosed within a main housing 504. This housing 504, and/or the arm base enclosure 330, may provide a clean room level enclosure that maintains particulate therein, without risk of polluting the workspace. As such, the arm base enclosure 330 and the main housing 504 may comprise a vacuum and/or be vacuum scavenged, and may be formed of a suitable material to maintain cleanliness, such as stainless steel. Of course, the skilled artisan will appreciate that aspects of the disclosed embodiments comprising, for example, stainless steel, may additionally be powder-coated.

Figure 6:
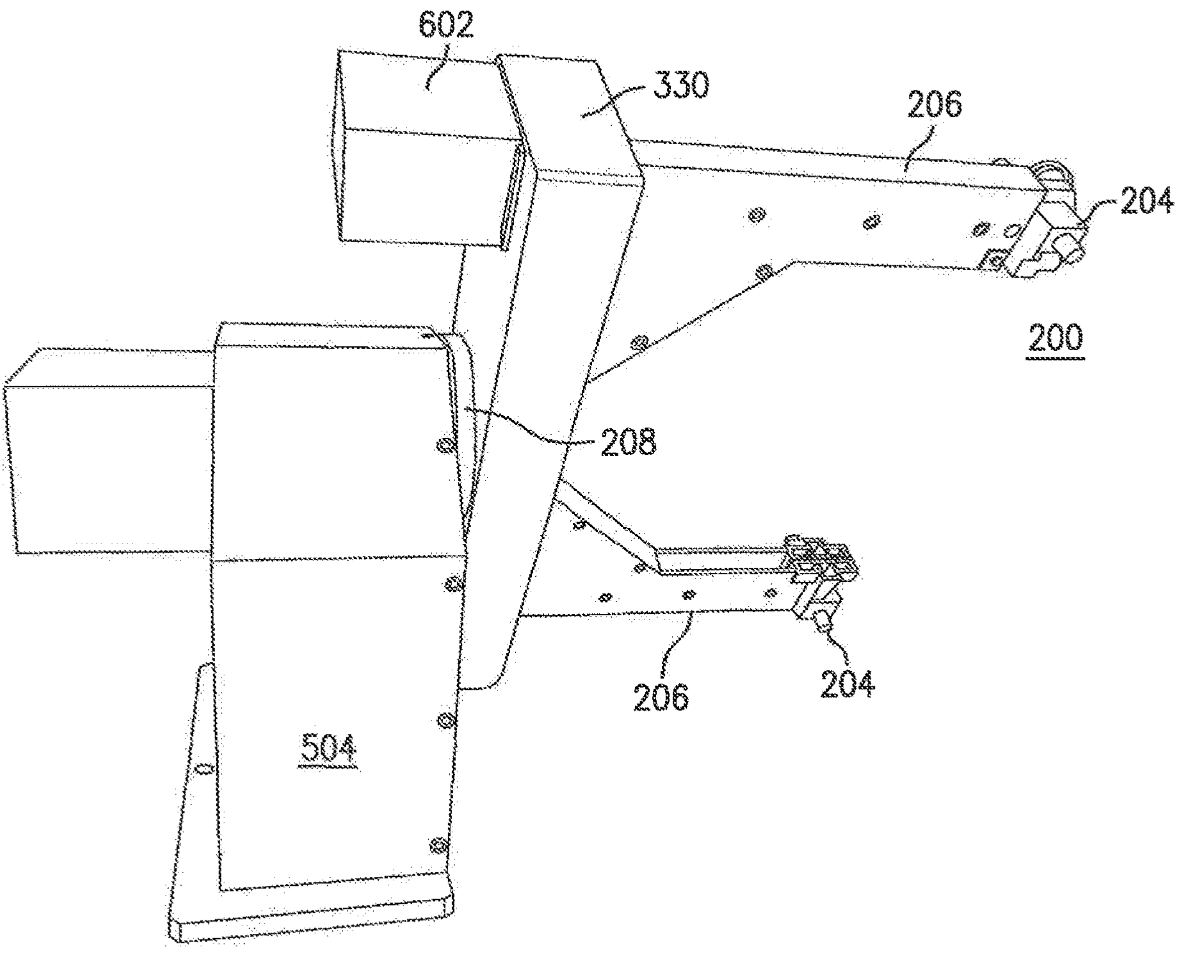
FIG. 6 is an illustration of aspects of a substrate flipper.

FIG. 6 illustrates a side view of the disclosed flipper 200 having the arms 206 rotated from co-resident on the horizontal access to substantially co-resident along the vertical access. This rotation is imparted by the rotating feature 208, as discussed throughout. The rotating feature 208 may provide for rotation from 0° (i.e., both arms co-resident on the horizontal access) to 180°, +/−0.05°, by way of nonlimiting example. The rotating feature 208 the main housing 504, and/or the arm base 330 may include, by way of nonlimiting example, travel stops 602 to maintain positional repeat ability of the rotated arms. By way of example, the rotation axes may have a highly refined repeatability, such as in the range of 1 to 5 μm, or more particularly 2 μm.

Figure 7:
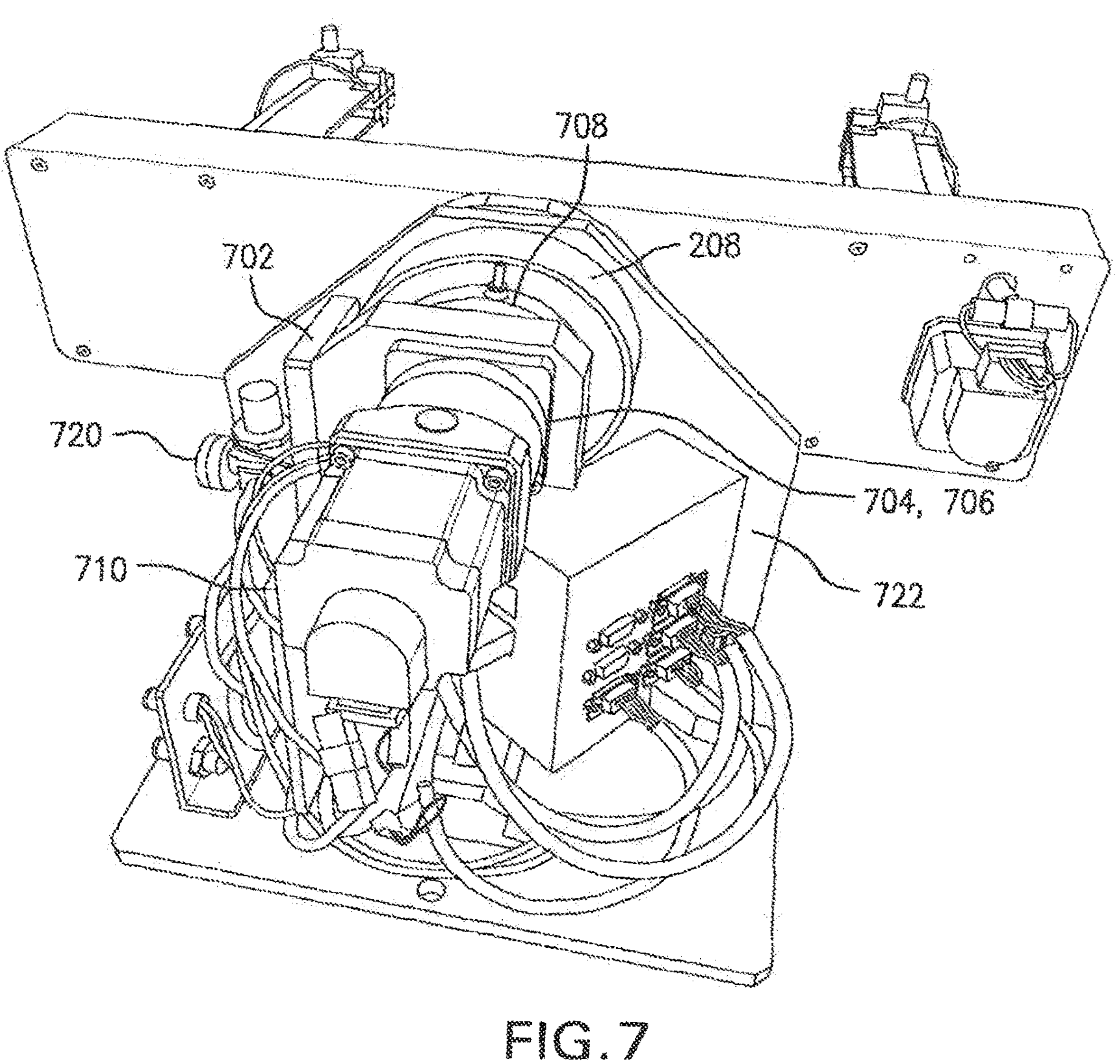
FIG. 7 is an illustration of aspects of a substrate flipper.

FIG. 7 illustrates aspects within the main housing 504 with the main housing 504 removed (not shown). As shown, the rotating feature 208 may be set within a rigid base 702, such as a billet aluminum base. The rotating feature 208 may comprise a gear head 704 having a bearing 706 in rotating communication with the front end 708 of the rotating feature 208, and a motor 710 to provide the rotation disclosed throughout. Although the illustrated motor 710 comprises servo motor, which may rotate on a high load capacity cross roller bearing, this motor is shown by way of nonlimiting example only. For example, it will further be appreciated by the skilled artisan that stepper or servo motor drives may be employed in the embodiments, and may further include motor encoding for refined positional assessment. The disclosed gear head 704 may include backlash compensation, such as in the range of less than one arc-min.

The disclosed arms 206 may support, and the rotating feature 208 may be capable of rotating, a payload scalable to 2 kg or more, by way of example. Also included within the main housing 504 and illustratively shown are pneumatic controls 720, and one or more programmable controllers 722 suitable to interface with the P and E interface 202 illustrated in FIG. 2.

Figure 8:
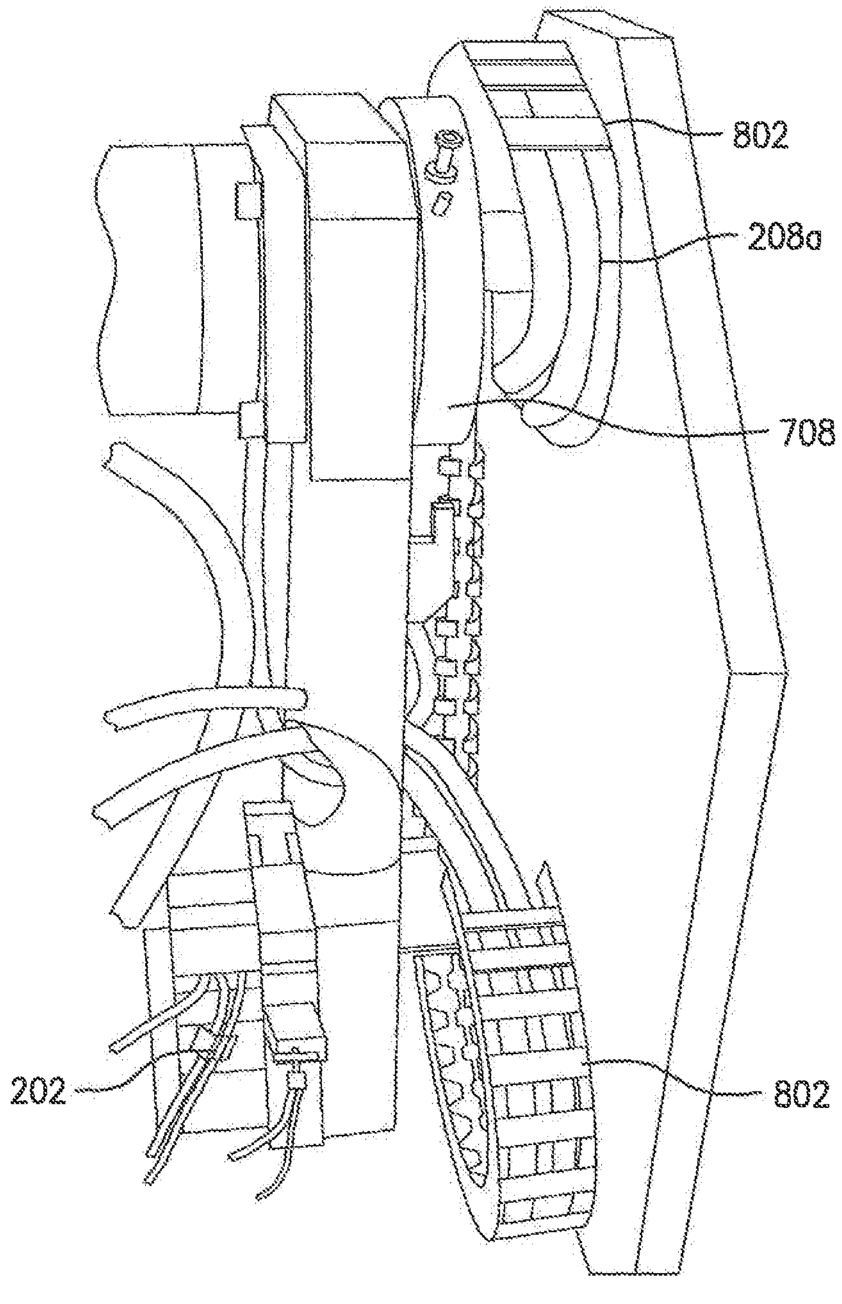
FIG. 8 is an illustration of aspects of a substrate flipper.

FIG. 8 further illustrates various aspects within the master housing 504 (not shown). Illustrated in FIG. 8 is the rotating feature front end 708, as well as an active wrapped electronic wiring harness 802 to positionally maintain the power and electronic/data cords from the P and E interface 202 within the main housing 504 and passing through the rotational interface 208*a* for the rotational feature 208 to the gripper base enclosure 330, and ultimately to the arms 206 and/or the grippers 204. The illustrated wiring harnesses 802 allows for distinct modular treatment of the aspects of the disclosed flipper 200. That is, mechanical and electrical independence of the various modules may be maintained, thus providing enhanced use flexibility and the capability to add additional functions to the different modules fed from the wiring harness, such as increased grip or controls, item sensing, and the like.

Figure 9:
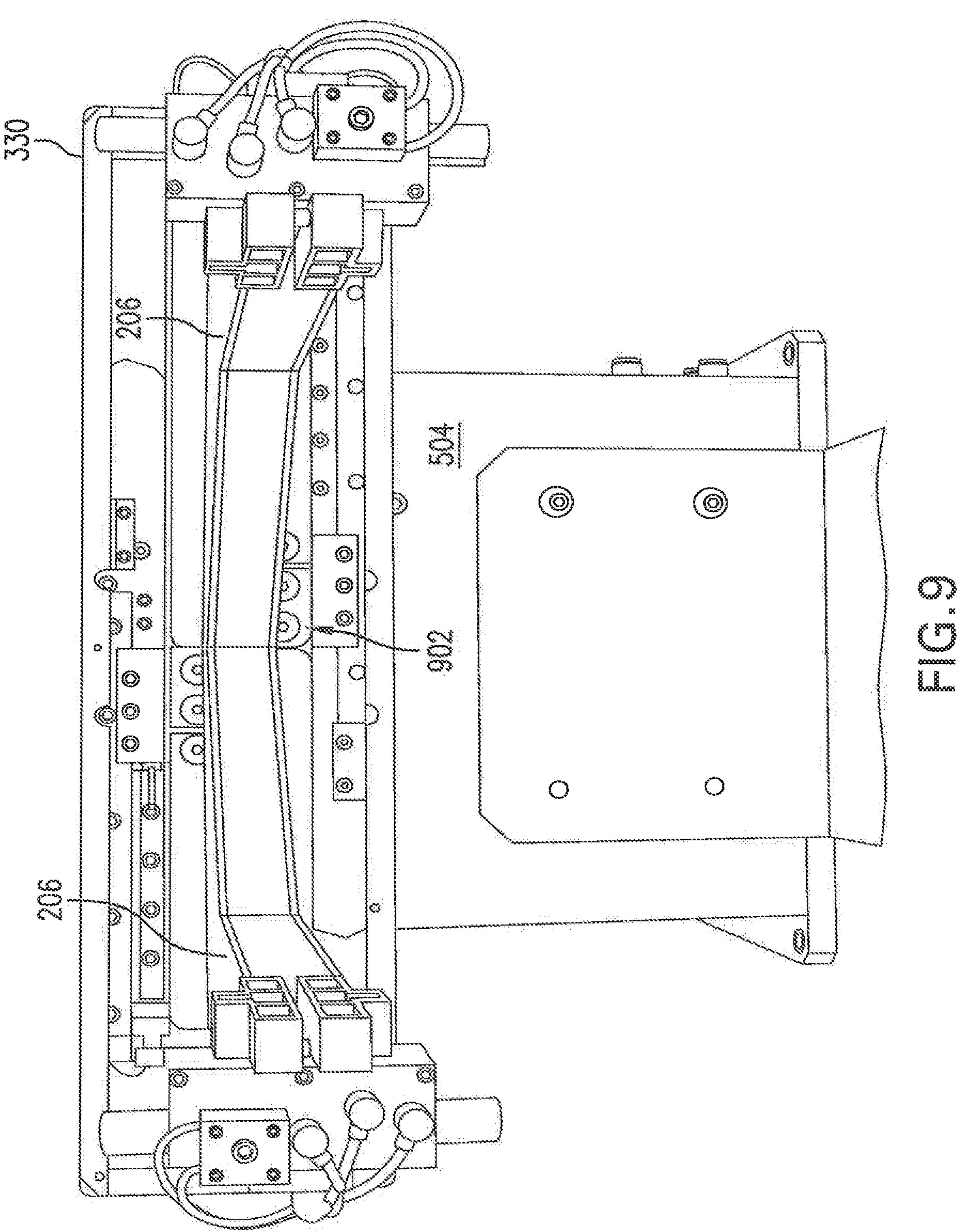
FIG. 9 is an illustration of aspects of a substrate flipper.

FIG. 9 provides a more detailed illustration of an exemplary arm base 330. As shown and as referenced above, labyrinth sealing plates 902 may be included to seal the arm base 330 as the arms 206 are adjusted, and/or to otherwise seal in conjunction with the motion of the arms. The noncontact plates 902 that overlap in the labyrinth seal thus prevent particle escape, and additionally allow for the presence of vacuum in both the arm base housing 330 and the main housing 504.

Figure 10:
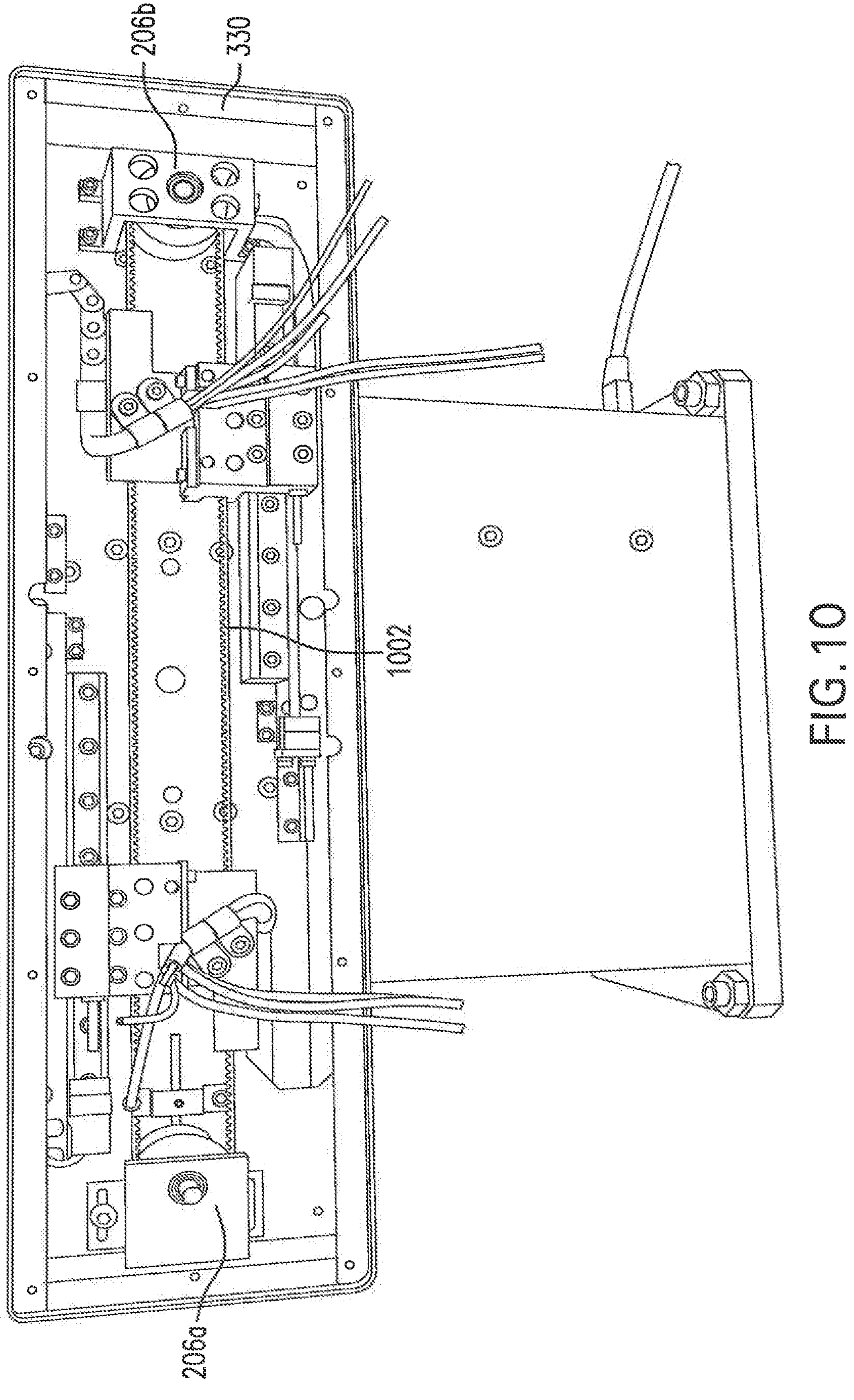
FIG. 10 illustrates aspects of a substrate flipper.

FIG. 10 illustrates an exemplary synchronization of the arms 206 (not shown). In the illustration, the use of a timing belt 1002 clamped to opposing sides within the arm base housing 330 and associated with the base of both arms 206*a*, 206*b* enables the aforementioned synchronization. The timing belt 1002 may be, by way of nonlimiting example, of polyurethane construction.

The foregoing apparatuses, systems and methods may also include the control of the various robotic and vacuum functionality referenced throughout. Such control may include, by way of non-limiting example, manual control using one or more user interfaces, such as a controller, a keyboard, a mouse, a touch screen, or the like, to allow a user to input instructions for execution by software code associated with the robotics and with the systems discussed herein. Additionally, and as is well known to those skilled in the art, system control may also be fully automated, such as wherein manual user interaction only occurs to "set up" and program the referenced functionality, i.e., a user may only initially program or upload computing code to carry out the predetermined movements and operational sequences discussed throughout. In either a manual or automated embodiment, or in any combination thereof, the control may be programmed, for example, to relate the known positions of substrates, the robotics, the stationary point, and the relative positions there between, for example.

It will be appreciated that the herein described systems and methods may operate pursuant to and/or be controlled by any computing environment, and thus the computing environment employed not limit the implementation of the herein described systems and methods to computing environments having differing components and configurations. That is, the concepts described herein may be implemented in any of various computing environments using any of various components and configurations.

Further, the descriptions of the disclosure are provided to enable any person skilled in the art to make or use the disclosed embodiments. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but rather is to be accorded the widest scope consistent with the principles and novel features disclosed herein.

What is claimed is:

1. A substrate flipper capable of accommodating substrates of varying sizes, comprising:

a base housing providing at least a portion of a rotating feature;

an arm enclosure rotatably associated with the rotating feature and providing:

two actuatable arms at two substantially distal points with respect to one another along the arm enclosure; and an actuatable gripper associated with each of the two arms distal from the arm enclosure capable of gripping one of the substrates upon actuation of the gripper;

wherein actuation of the arms effectuates a change in distance between central longitudinal axes of each of the two arms; and wherein the arm enclosure rotates the arms about a horizontal axis.

2. The substrate flipper of claim 1, wherein the base housing includes a power and electronic data interface.

3. The substrate flipper of claim 1, wherein the arm enclosure is configured to rotate 180 degrees.

4. The substrate flipper of claim 1, wherein the substrate comprises one selected from the group consisting of a film frame, a bare wafer, a processed wafer, and a glass reticle.

5. The substrate flipper of claim 4, wherein the film frame has a diameter in a range of 200 mm to 300 mm.

6. The substrate flipper of claim 4, wherein the processed wafer has a diameter in a range of 200 m to 300 mm.

7. The substrate flipper of claim 1, wherein the substrate has a diameter in a range of 200 mm to 450 mm.

8. The substrate flipper of claim 1, wherein the actuation of the arms.

9. The substrate flipper of claim 8, further comprising at least one size sensor of the substrate, wherein the automatic actuation is responsive to an output of the size sensor.

10. The substrate flipper of claim 1, wherein the change in distance is in a range of 150 mm to 250 mm.

11. The substrate flipper of claim 10, wherein the change in distance is about 190 mm.

12. The substrate flipper of claim 1, wherein the arm enclosure comprises a labyrinth style enclosure wherein the arm enclosure remains sealed upon movement of the arms.

13. The substrate flipper of claim 1, wherein the arm enclosure is under vacuum configured to maintain particulate therein to enhance cleanliness.

14. The substrate flipper of claim 1, wherein the gripper is under vacuum configured to maintain particulate therein to enhance cleanliness.

15. The substrate flipper of claim 14, wherein the gripper comprises roller bearings under vacuum configured to maintain particulate therein to enhance cleanliness.

16. The substrate flipper of claim 1, wherein the base housing is under vacuum configured to maintain particulate therein to enhance cleanliness.

17. The substrate flipper of claim 1, wherein the gripper comprises closed-loop sensing.

18. The substrate flipper of claim 17, wherein the closed-loop sensing comprised at least one of beam sensing, programmable pressure sensing, and weight transducers.

19. The substrate flipper of claim 1, wherein the gripper comprises rubber clamps.

20. The substrate flipper of claim 1, wherein the base housing and the arm enclosure comprise stainless steel.

21. The substrate flipper of claim 20, wherein the stainless steel is powder-coated.

22. The substrate flipper of claim 1, wherein the base housing comprises a wrapped electronic wiring harness that moves with rotation of the two arms.

23. The substrate flipper of claim 1, wherein the change in distance is synchronized between the two arms.

24. The substrate flipper of claim 23, wherein the synchronization is provided by a timing belt clamped to opposing sides of the arm enclosure.

25. The substrate flipper of claim 24, wherein the timing belt is composed of polyurethane.

* * * * *